US009450041B2

(12) United States Patent
Lin et al.

(10) Patent No.: US 9,450,041 B2
(45) Date of Patent: Sep. 20, 2016

(54) STACKABLE HIGH-DENSITY METAL-OXIDE-METAL CAPACITOR WITH MINIMUM TOP PLATE PARASITIC CAPACITANCE

(71) Applicant: Marvell World Trade, Ltd., St. Michael (BB)

(72) Inventors: Hung Sheng Lin, San Jose, CA (US); Xiaoyue Wang, Santa Clara, CA (US)

(73) Assignee: Marvell World Trade LTD., St. Michael (BB)

( * ) Notice: Subject to any disclaimer, the term of this patent is extended or adjusted under 35 U.S.C. 154(b) by 127 days.

(21) Appl. No.: 14/086,154

(22) Filed: Nov. 21, 2013

(65) Prior Publication Data

US 2014/0145304 A1    May 29, 2014

Related U.S. Application Data

(60) Provisional application No. 61/730,716, filed on Nov. 28, 2012.

(51) Int. Cl.
| | |
|---|---|
| *H01L 23/52* | (2006.01) |
| *H01L 49/02* | (2006.01) |
| *H01G 4/005* | (2006.01) |
| *H01G 4/228* | (2006.01) |
| *H01L 23/522* | (2006.01) |
| *H01G 4/38* | (2006.01) |
| *H01G 4/10* | (2006.01) |

(52) U.S. Cl.
CPC .............. *H01L 28/60* (2013.01); *H01G 4/005* (2013.01); *H01G 4/228* (2013.01); *H01G 4/38* (2013.01); *H01L 23/5223* (2013.01); *H01L 28/82* (2013.01); *H01L 28/87* (2013.01); *H01L 28/91* (2013.01); *H01G 4/10* (2013.01); *H01L 2924/0002* (2013.01)

(58) Field of Classification Search
None
See application file for complete search history.

(56) References Cited

U.S. PATENT DOCUMENTS

| 7,456,462 B1 * | 11/2008 | Heshami | H01L 23/5223 |
| | | | 257/296 |
| 7,561,407 B1 * | 7/2009 | Chen et al. | 361/306.1 |
| 8,536,677 B2 * | 9/2013 | Baumgartner | H01L 23/5223 |
| | | | 257/503 |
| 9,111,689 B2 * | 8/2015 | Cho | H01G 4/232 |
| 2003/0206389 A1 | 11/2003 | Hajimiri et al. | |

(Continued)

OTHER PUBLICATIONS

Aparicio, Roberto et al., "Capacity Limits and Matching Properties of Integrated Capacitors," IEEE Journal of Solid-State Circuits, vol. 37, No. 3; XP011061701; ISSN: 0018-9200; Mar. 2002.

(Continued)

*Primary Examiner* — Benjamin Sandvik

(57) ABSTRACT

A system including first and second plurality of conductors stacked along a first axis on a substrate. The first axis is perpendicular to a plane on which the substrate lies. In the first and second plurality of conductors, each conductor is connected to an adjacent conductor by one or more first vias arranged along the first axis. The first and second plurality of conductors are arranged in parallel along a second axis (i) perpendicular to the first axis and (ii) parallel to the plane on which the substrate lies. The first plurality of conductors respectively lie on a plurality of planes (i) perpendicular to the first axis and (ii) parallel to the plane on which the substrate lies. The second plurality of conductors respectively lie on the plurality of planes. Capacitances are formed along the plurality of planes between the first plurality of conductors and the second plurality of conductors.

16 Claims, 5 Drawing Sheets

(56) References Cited

U.S. PATENT DOCUMENTS

| | | |
|---|---|---|
| 2005/0145987 A1* | 7/2005 | Okuda et al. .................. 257/532 |
| 2005/0259379 A1* | 11/2005 | Bely et al. .................. 361/306.1 |
| 2006/0221541 A1* | 10/2006 | Yeh et al. ..................... 361/272 |
| 2007/0215928 A1 | 9/2007 | McLeod |
| 2007/0267673 A1 | 11/2007 | Kim et al. |
| 2008/0186651 A1* | 8/2008 | Thompson ............. H01G 4/228 361/306.3 |
| 2012/0212877 A1* | 8/2012 | Lu .......................... H01G 5/015 361/301.4 |
| 2012/0286394 A1 | 11/2012 | Sutardja |

OTHER PUBLICATIONS

International Search Report and Written Opinion for Application No. PCT/US32013/071367 dated Mar. 13, 2014; 13 Pages.

* cited by examiner

STACKABLE HIGH-DENSITY METAL-OXIDE-METAL CAPACITOR WITH MINIMUM TOP PLATE PARASITIC CAPACITANCE

CROSS-REFERENCE TO RELATED APPLICATIONS

This application claims the benefit of U.S. Provisional Application No. 61/730,716, filed on Nov. 28, 2012. The entire disclosure of the application referenced above is incorporated herein by reference.

FIELD

The present disclosure relates generally to integrated circuits and more particularly to stackable high-density metal-oxide-metal (MOM) capacitor with minimum parasitic capacitance to top plate.

BACKGROUND

Many circuits include a capacitor array with multiple capacitors. The capacitors in the capacitor array usually have large geometries to keep the percentage of parasitic capacitance below design specifications (usually well below inherent capacitance values) or to increase matching performance. To build the capacitor array with many capacitors, large capacitance values and array area are required, which increases cost.

SUMMARY

A system comprises a first plurality of conductors and a second plurality of conductors. The first plurality of conductors is stacked along a first axis on a substrate of an integrated circuit. The first axis is perpendicular to a plane on which the substrate lies. Each conductor in the first plurality of conductors is connected to an adjacent conductor in the first plurality of conductors by one or more first vias arranged along the first axis. The second plurality of conductors is stacked along the first axis on the substrate of the integrated circuit. Each conductor in the second plurality of conductors is connected to an adjacent conductor in the second plurality of conductors by one or more second vias arranged along the first axis. The first plurality of conductors and the second plurality of conductors are arranged in parallel along a second axis (i) perpendicular to the first axis and (ii) parallel to the plane on which the substrate lies. The first plurality of conductors respectively lie on a plurality of planes (i) perpendicular to the first axis and (ii) parallel to the plane on which the substrate lies. The second plurality of conductors respectively lie on the plurality of planes. Capacitances are formed along the plurality of planes between the first plurality of conductors and the second plurality of conductors.

In another feature, capacitances are formed along the plurality of planes between the first vias and the second vias.

In another feature, a number of conductors in the first plurality of conductors is equal to a number of conductors in the second plurality of conductors.

In another feature, a number of conductors in the second plurality of conductors is greater than a number of conductors in the first plurality of conductors.

In other features, conductors in the first plurality of conductors and the second plurality of conductors have predetermined dimensions. Conductors in the first plurality of conductors and the second plurality of conductors are separated by a first predetermined distance. The first plurality of conductors and the second plurality of conductors are separated by a second predetermined distance. Values of the capacitances between the first plurality of conductors and the second plurality of conductors depend on one or more of (i) the predetermined dimensions, (ii) the first predetermined distance, and (iii) the second predetermined distance.

In another feature, the system further comprises a third plurality of conductors stacked along the first axis on the substrate of the integrated circuit. The second plurality of conductors is arranged in parallel to and between the first plurality of conductors and the third plurality of conductors along the second axis. Each conductor in the third plurality of conductors is connected to an adjacent conductor in the third plurality of conductors by one or more third vias arranged along the first axis. The third plurality of conductors respectively lie on the plurality of planes. Capacitances are formed along the plurality of planes between the second plurality of conductors and the third plurality of conductors.

In other features, a number of conductors in the first plurality of conductors is equal to a number of conductors in the third plurality of conductors. A number of conductors in the second plurality of conductors is greater than a number of conductors in the first plurality of conductors.

In other features, conductors in the first plurality of conductors, the second plurality of conductors, and the third plurality of conductors have predetermined dimensions. Conductors in the first plurality of conductors, the second plurality of conductors, and the third plurality of conductors are separated by a first predetermined distance. The first, the second, and the third pluralities of conductors are separated by a second predetermined distance. Values of the capacitances between the first plurality of conductors and the second plurality of conductors and between the second plurality of conductors and the third plurality of conductors depend on one or more of (i) the predetermined dimensions, (ii) the first predetermined distance, and (iii) the second predetermined distance.

In another feature, capacitances are formed along the plurality of planes between the second vias and the third vias.

In still other features, a system comprises a first set of conductors, a second set of conductors, and a third set of conductors. Conductors in each of the first, second, and third sets are stacked along a first axis on a substrate of an integrated circuit. The first axis is perpendicular to a plane on which the substrate lies. In each of the first, second, and third sets, each conductor is connected to an adjacent conductor by one or more vias along the first axis. The first, second, and third sets of conductors are arranged in parallel along a second axis (i) perpendicular to the first axis and (ii) parallel to the plane on which the substrate lies. The second set of conductors is arranged between the first set of conductors and the third set of conductors. The first set of conductors respectively lie on a plurality of planes (i) perpendicular to the first axis, and (ii) parallel to the plane on which the substrate lies. The second set of conductors respectively lie on the plurality of planes. The third set of conductors respectively lie on the plurality of planes.

In other features, capacitances are formed along the plurality of planes between the first set of conductors and the second set of conductors. Capacitances are formed along the plurality of planes between the second set of conductors and the third set of conductors.

In other features, a number of conductors in the first set of conductors is equal to a number of conductors in the third set of conductors. A number of conductors in the second set of conductors is less than a number of conductors in the first set of conductors.

In another feature, a first conductor in the first set of conductors is connected to a first conductor in the third set of conductors by a connection along the second axis.

In other features, the system further comprises a fourth set of conductors and a fifth set of conductors. Conductors in each of the fourth and fifth sets are stacked along the first axis on the substrate of the integrated circuit. In each of the fourth and fifth sets, each conductor is connected to an adjacent conductor by one or more vias along the first axis. The fourth and fifth sets of conductors are arranged in parallel along the second axis. The fourth set of conductors respectively lie on the plurality of planes. The fifth set of conductors respectively lie on the plurality of planes. The fourth set of conductors is arranged between the third set of conductors and the fifth set of conductors.

In other features, capacitances are formed along the plurality of planes between the first set of conductors and the second set of conductors. Capacitances are formed along the plurality of planes between the second set of conductors and the third set of conductors. Capacitances are formed along the plurality of planes between the third set of conductors and the fourth set of conductors. Capacitances are formed along the plurality of planes between the fourth set of conductors and the fifth set of conductors.

In other features, a number of conductors in the first set of conductors is equal to a number of conductors in the third set of conductors and is equal to a number of conductors in the fifth set of conductors. A number of conductors in the second set of conductors is equal to a number of conductors in the fourth set of conductors and is less than a number of conductors in the first set of conductors.

In another feature, a first conductor in the first set of conductors is connected to a first conductor in the third set of conductors and to a first conductor in the fifth set of conductors by a connection along the second axis.

In other features, the system further comprises a sixth set of conductors, a seventh set of conductors, and an eighth set of conductors. Conductors in each of the sixth, seventh, and eighth sets are stacked along the first axis on the substrate of the integrated circuit. In each of the sixth, seventh, and eighth sets, each conductor is connected to an adjacent conductor by one or more vias along the first axis. The sixth, seventh, and eighth sets of conductors are arranged in parallel along the second axis. The sixth set of conductors lie adjacent to the first set of conductors along a third axis perpendicular to the first and second axes. The seventh set of conductors lie adjacent to the second set of conductors along the third axis. The eighth set of conductors lie adjacent to the third set of conductors along the third axis. The seventh set of conductors is arranged between the sixth set of conductors and the eighth set of conductors. the sixth, seventh, and eighth sets of conductors respectively lie on the plurality of planes.

In other features, capacitances are formed along the plurality of planes between the first set of conductors and the second set of conductors. Capacitances are formed along the plurality of planes between the second set of conductors and the third set of conductors. Capacitances are formed along the plurality of planes between the third set of conductors and the fourth set of conductors. Capacitances are formed along the plurality of planes between the fourth set of conductors and the fifth set of conductors. Capacitances are formed along the plurality of planes between the sixth set of conductors and the seventh set of conductors. Capacitances are formed along the plurality of planes between the seventh set of conductors and the eighth set of conductors.

In another feature, a first conductor in the sixth set of conductors is connected to a first conductor in the eighth set of conductors by a connection along the second axis.

In another feature, a conductor other than first and last conductors in the seventh set of conductors is connected to a conductor other than first and last conductors in the second set of conductors along the third axis.

In still other features, a method comprises arranging a first plurality of conductors on a substrate of an integrated circuit. The first plurality of conductors is stacked along a first axis on the substrate. The first axis is perpendicular to a plane on which the substrate lies. The method further comprises connecting each conductor in the first plurality of conductors to an adjacent conductor in the first plurality of conductors by one or more first vias arranged along the first axis. The method further comprises arranging a second plurality of conductors on the substrate of the integrated circuit. The second plurality of conductors is stacked along the first axis on the substrate. The method further comprises connecting each conductor in the second plurality of conductors to an adjacent conductor in the second plurality of conductors by one or more second vias arranged along the first axis. The method further comprises arranging the first plurality of conductors and the second plurality of conductors in parallel along a second axis (i) perpendicular to the first axis and (ii) parallel to the plane on which the substrate lies. The method further comprises arranging the first plurality of conductors respectively along a plurality of planes (i) perpendicular to the first axis and (ii) parallel to the plane on which the substrate lies. The method further comprises arranging the second plurality of conductors respectively along the plurality of planes. Capacitances are formed along the plurality of planes between the first plurality of conductors and the second plurality of conductors.

In another feature, capacitances are formed along the plurality of planes between the first vias and the second vias.

In another feature, a number of conductors in the first plurality of conductors is equal to a number of conductors in the second plurality of conductors.

In another feature, a number of conductors in the second plurality of conductors is greater than a number of conductors in the first plurality of conductors.

In other features, conductors in the first plurality of conductors and the second plurality of conductors have predetermined dimensions. Conductors in the first plurality of conductors and the second plurality of conductors are separated by a first predetermined distance. The first plurality of conductors and the second plurality of conductors are separated by a second predetermined distance. Values of the capacitances between the first plurality of conductors and the second plurality of conductors depend on one or more of (i) the predetermined dimensions, (ii) the first predetermined distance, and (iii) the second predetermined distance.

In other features, the method further comprises arranging a third plurality of conductors on the substrate of the integrated circuit. The third plurality of conductors is stacked along the first axis on the substrate. The method further comprises arranging the second plurality of conductors in parallel to and between the first plurality of conductors and the third plurality of conductors along the second axis. The method further comprises connecting each conductor in the third plurality of conductors to an adjacent conductor in the third plurality of conductors by one or more third vias arranged along the first axis. The method further comprises arranging the third plurality of conductors respectively along the plurality of planes. Capacitances are formed along the plurality of planes between the second plurality of conductors and the third plurality of conductors.

In other features, a number of conductors in the first plurality of conductors is equal to a number of conductors in the third plurality of conductors. A number of conductors in the second plurality of conductors is greater than a number of conductors in the first plurality of conductors.

In other features, conductors in the first plurality of conductors, the second plurality of conductors, and the third plurality of conductors have predetermined dimensions. Conductors in the first plurality of conductors, the second plurality of conductors, and the third plurality of conductors are separated by a first predetermined distance. The first, the second, and the third pluralities of conductors are separated by a second predetermined distance. Values of the capacitances between the first plurality of conductors and the second plurality of conductors and between the second plurality of conductors and the third plurality of conductors depend on one or more of (i) the predetermined dimensions, (ii) the first predetermined distance, and (iii) the second predetermined distance.

In another feature, capacitances are formed along the plurality of planes between the second vias and the third vias.

In still other features, a method comprises arranging a first set of conductors, a second set of conductors, and a third set of conductors on a substrate of an integrated circuit. Conductors in each of the first, second, and third sets are stacked along a first axis on the substrate. The first axis is perpendicular to a plane on which the substrate lies. The method further comprises, in each of the first, second, and third sets, connecting each conductor to an adjacent conductor by one or more vias along the first axis. The method further comprises arranging the first, second, and third sets of conductors in parallel along a second axis (i) perpendicular to the first axis and (ii) parallel to the plane on which the substrate lies. The method further comprises arranging the second set of conductors between the first set of conductors and the third set of conductors. The method further comprises arranging the first set of conductors respectively along a plurality of planes (i) perpendicular to the first axis, and (ii) parallel to the plane on which the substrate lies. The method further comprises arranging the second set of conductors respectively along the plurality of planes. The method further comprises arranging the third set of conductors respectively along the plurality of planes.

In other features, capacitances are formed along the plurality of planes between the first set of conductors and the second set of conductors. Capacitances are formed along the plurality of planes between the second set of conductors and the third set of conductors.

In other features, a number of conductors in the first set of conductors is equal to a number of conductors in the third set of conductors. A number of conductors in the second set of conductors is less than a number of conductors in the first set of conductors.

In another feature, the method further comprises connecting a first conductor in the first set of conductors to a first conductor in the third set of conductors by a connection along the second axis.

In another feature, the method further comprises arranging a fourth set of conductors and a fifth set of conductors on the substrate of the integrated circuit. Conductors in each of the fourth and fifth sets are stacked along the first axis on the substrate. The method further comprises, in each of the fourth and fifth sets, connecting each conductor to an adjacent conductor by one or more vias along the first axis. The method further comprises arranging the fourth and fifth sets of conductors in parallel along the second axis. The method further comprises arranging the fourth set of conductors respectively along the plurality of planes. The method further comprises arranging the fifth set of conductors respectively along the plurality of planes. The method further comprises arranging the fourth set of conductors between the third set of conductors and the fifth set of conductors.

In other features, capacitances are formed along the plurality of planes between the first set of conductors and the second set of conductors. Capacitances are formed along the plurality of planes between the second set of conductors and the third set of conductors. Capacitances are formed along the plurality of planes between the third set of conductors and the fourth set of conductors. Capacitances are formed along the plurality of planes between the fourth set of conductors and the fifth set of conductors.

In other features, a number of conductors in the first set of conductors is equal to a number of conductors in the third set of conductors and is equal to a number of conductors in the fifth set of conductors. A number of conductors in the second set of conductors is equal to a number of conductors in the fourth set of conductors and is less than a number of conductors in the first set of conductors.

In another feature, the method further comprises connecting a first conductor in the first set of conductors is connected to a first conductor in the third set of conductors and to a first conductor in the fifth set of conductors by a connection along the second axis.

In other features, the method further comprises arranging a sixth set of conductors, a seventh set of conductors, and an eighth set of conductors on the substrate of the integrated circuit. Conductors in each of the sixth, seventh, and eighth sets are stacked along the first axis on the substrate. The method further comprises, in each of the sixth, seventh, and eighth sets, connecting each conductor to an adjacent conductor by one or more vias along the first axis. The method further comprises arranging the sixth, seventh, and eighth sets of conductors in parallel along the second axis. The method further comprises arranging the sixth set of conductors adjacent to the first set of conductors along a third axis perpendicular to the first and second axes. The method further comprises arranging the seventh set of conductors adjacent to the second set of conductors along the third axis. The method further comprises arranging the eighth set of conductors adjacent to the third set of conductors along the third axis. The method further comprises arranging the seventh set of conductors between the sixth set of conductors and the eighth set of conductors. The method further comprises arranging the sixth, seventh, and eighth sets of conductors respectively along the plurality of planes.

In other features, capacitances are formed along the plurality of planes between the first set of conductors and the second set of conductors. Capacitances are formed along the plurality of planes between the second set of conductors and the third set of conductors. Capacitances are formed along the plurality of planes between the third set of conductors and the fourth set of conductors. Capacitances are formed along the plurality of planes between the fourth set of conductors and the fifth set of conductors. Capacitances are formed along the plurality of planes between the sixth set of conductors and the seventh set of conductors. Capacitances are formed along the plurality of planes between the seventh set of conductors and the eighth set of conductors.

In another feature, the method further comprises connecting a first conductor in the sixth set of conductors to a first conductor in the eighth set of conductors by a connection along the second axis.

In another feature, the method further comprises connecting a conductor other than first and last conductors in the seventh set of conductors to a conductor other than first and last conductors in the second set of conductors along the third axis.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF DRAWINGS

In the drawings, reference numbers may be reused to identify similar and/or identical elements.

DESCRIPTION

The present disclosure relates to a metal-oxide-metal (MOM) capacitor array structure. As explained below with reference to FIGS. 1-4, the capacitor array has a unit structure including a center wall of vertically stacked metal wires (conductors). The vertically stacked metal wires are interconnected by vias. The center wall (top plate) is arranged between two walls made of similar stacked structure (bottom plate). A bottom plate is shared between two adjacent unit structures. This structure minimizes parasitic capacitance to the top plate. The bottom plates are connected at the top or bottom of the capacitor array. The bottom plate connection serves as a shield layer to reduce fringing capacitance between the top plate and external connections of the capacitor array. The top plates are connected in a direction perpendicular to the direction in which the bottom plates are connected. The top plate connections run parallel to each other and are eventually connected at one or both ends of the capacitor array to external circuit elements.

As further explained below with reference to FIGS. 1-4, a dummy cell with the same unit structure is arranged next to the outermost array boundary. The dummy cells are connected to a predetermined potential to improve uniformity of the array without adding parasitic capacitance to the top plate. Dummy connections are arranged at the sides of the top plate connections. The dummy connections are used to connect the top plates of the dummy cells to a predetermined potential.

As further explained below with reference to FIGS. 1-4, the unit structure can be replicated or stacked along horizontal and vertical axes. The size (i.e., the value of the capacitance) of the resulting capacitor can be adjusted by reconfiguring bottom or top plate connections. Segment lengths of the top and bottom plates can be adjusted to match pitch of adjacent logic in the integrated circuit. The density of the capacitor array can be adjusted by varying spacing, segment width, and metal-to-VIA overlay. The top and bottom plates can have different number of stacked metal layers depending on capacitor density and parasitic capacitance requirement.

Figure 1:
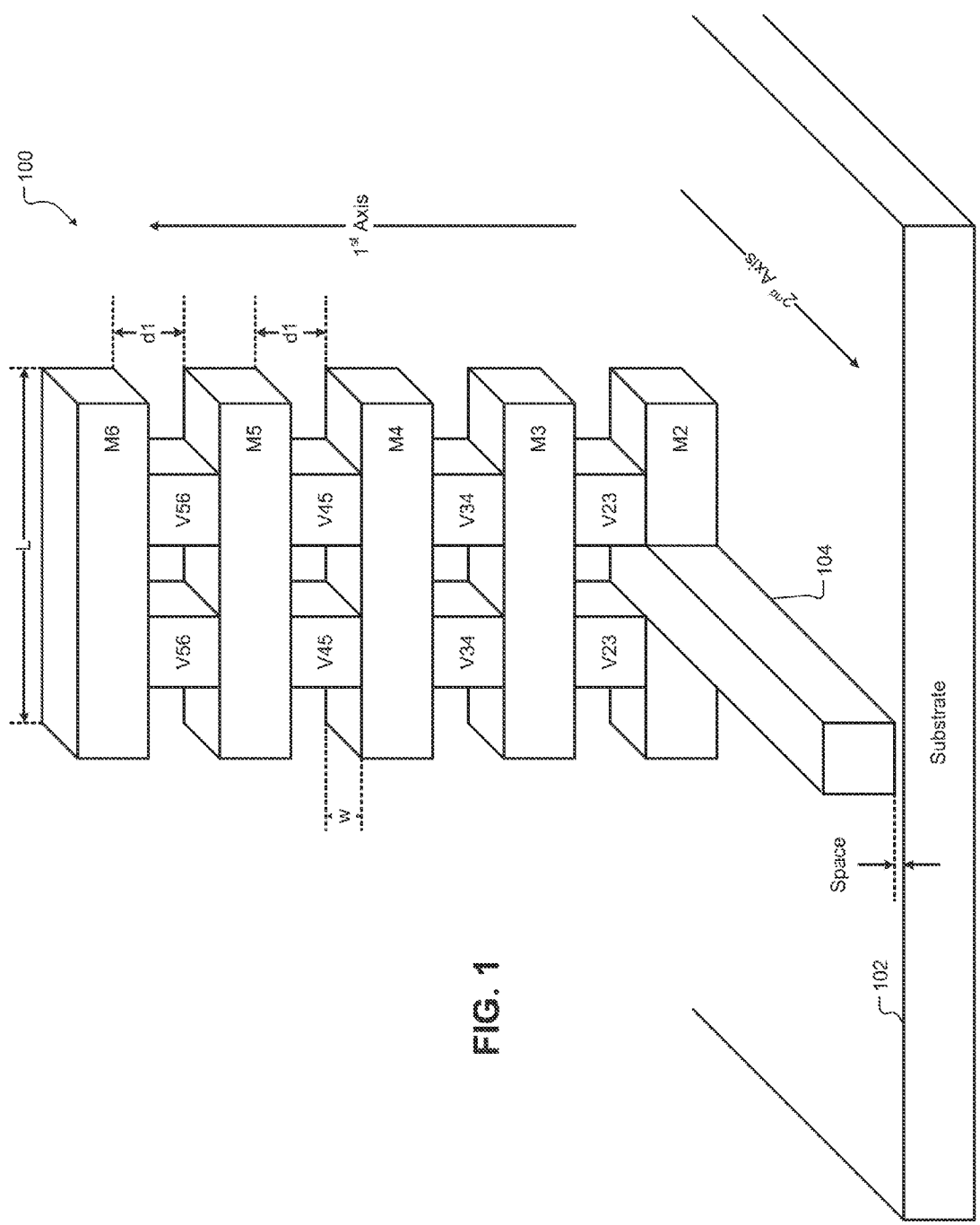
FIG. 1 shows an example of a bottom plate of a capacitor unit used in a capacitor array according to the present disclosure.

FIG. 1 shows an example of a bottom plate 100. The bottom plate 100 includes a plurality of conductors arranged on a substrate 102 as shown. For example only, the plurality of conductors is denoted as M2, M3, M4, M5, and M6. The number of conductors in the bottom plate 100 may be more or less than the number shown. The plurality of conductors is stacked along a first axis. The first axis is perpendicular to a plane on which the substrate 102 lies. Each conductor in the bottom plate 100 is separated from an adjacent conductor by a predetermined distance d1.

Each conductor in the bottom plate 100 is of a predetermined length L (segment length) and a predetermined width W (segment width). Each conductor in the bottom plate 100 is connected to an adjacent conductor by one or more vias. For example only, the vias are denoted as V23, V34, V45, and V56. In the notation $V_{pq}$, p and q denote the numbers of the conductors connected by the via $V_{pq}$. The number of vias used to connect adjacent conductors may differ depending on the predetermined length L of the conductors. For example, the number of vias may be less or more than the two vias shown if the predetermined length L of the conductors $M_x$ is shorter or longer than shown.

Figure 3:
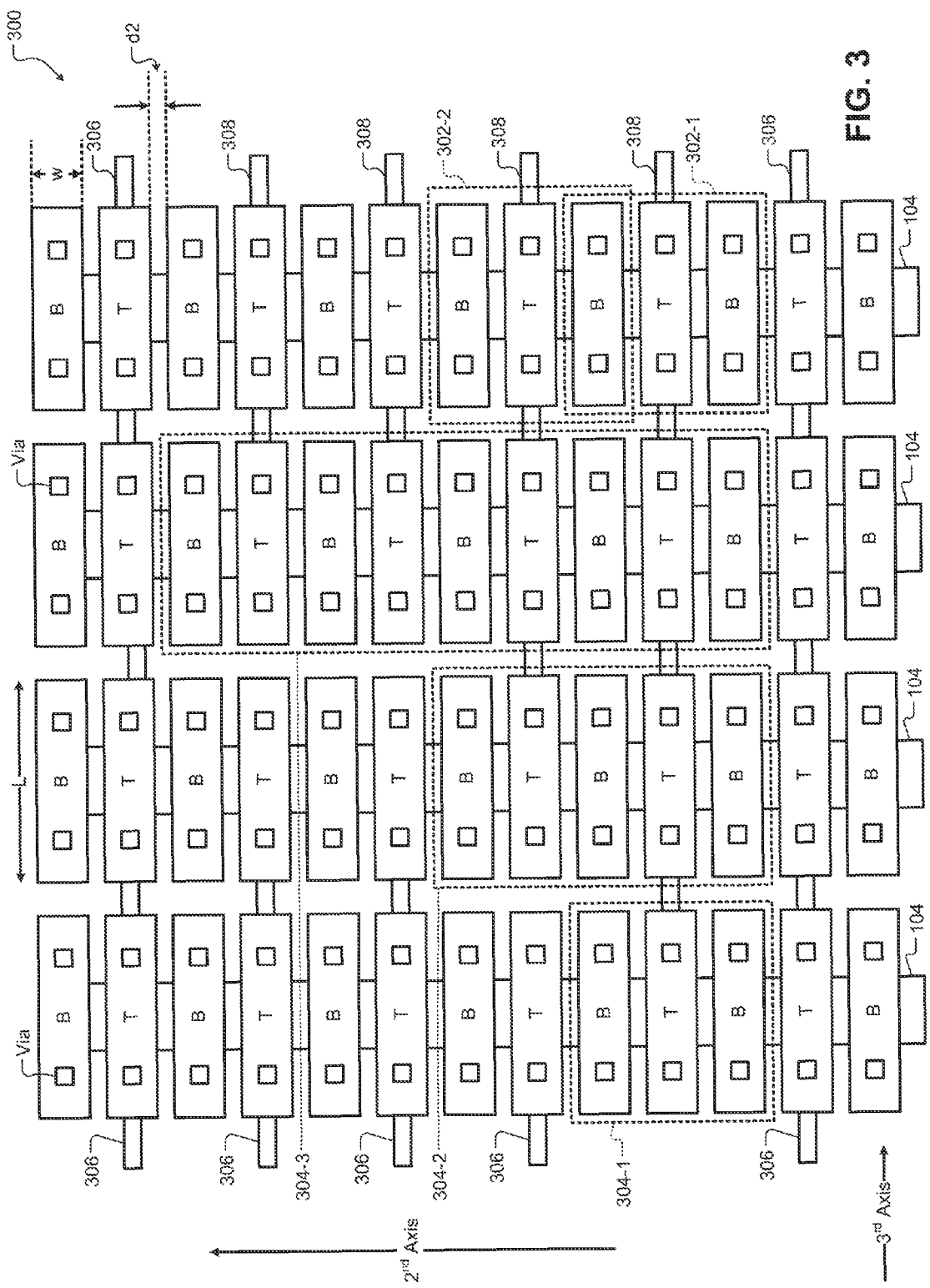
FIG. 3 shows an example of a top view of a capacitor array including a plurality of bottom plates and a plurality of top plates according to the present disclosure.

A connection 104 connects the bottommost conductor (e.g., M2) of the bottom plate 100 to a bottommost conductor of another bottom plate (not shown here, but see FIG. 3). Alternatively, a connection similar to the connection 104 connects the topmost conductor (e.g., M6) of the bottom plate 100 to a topmost conductor of another bottom plate (not shown here, but see FIG. 3). The other bottom plate is arranged similar to the bottom plate 100 and is arranged in parallel to the bottom plate 100 on the substrate 102 along a second axis. The second axis is parallel to the plane on which the substrate 102 lies. The connection 104 extends parallel to the second axis. The conductor M2 of the bottom plate 100 and a conductor M2 of another bottom plate lie on a plane parallel to the plane on which the substrate 102 lies. Similarly, the conductor M3 of the bottom plate 100 and a conductor M3 of the other bottom plate lie on a plane parallel to the plane on which the substrate 102 lies, and so on.

A space is shown between the conductor M2 and the substrate 102. A metal layer M1 between the conductor M2 and the substrate 102, a contact between the metal layer M1 and the substrate 102, and at least one via (e.g., V12) connecting the metal layer M1 to the conductor M2 and other suitable layers can be formed in the space. Thus, in the example shown, the order of stacking is substrate 102, contact, metal layer M1, via V12, conductor M2, via V23, conductor M3, via V34, conductor M4, via V45, conductor M5, via V56, and conductor M6. The conductors M2-M6 can be of different width and length although having the same dimensions yields maximum capacitor density.

Figure 2A:
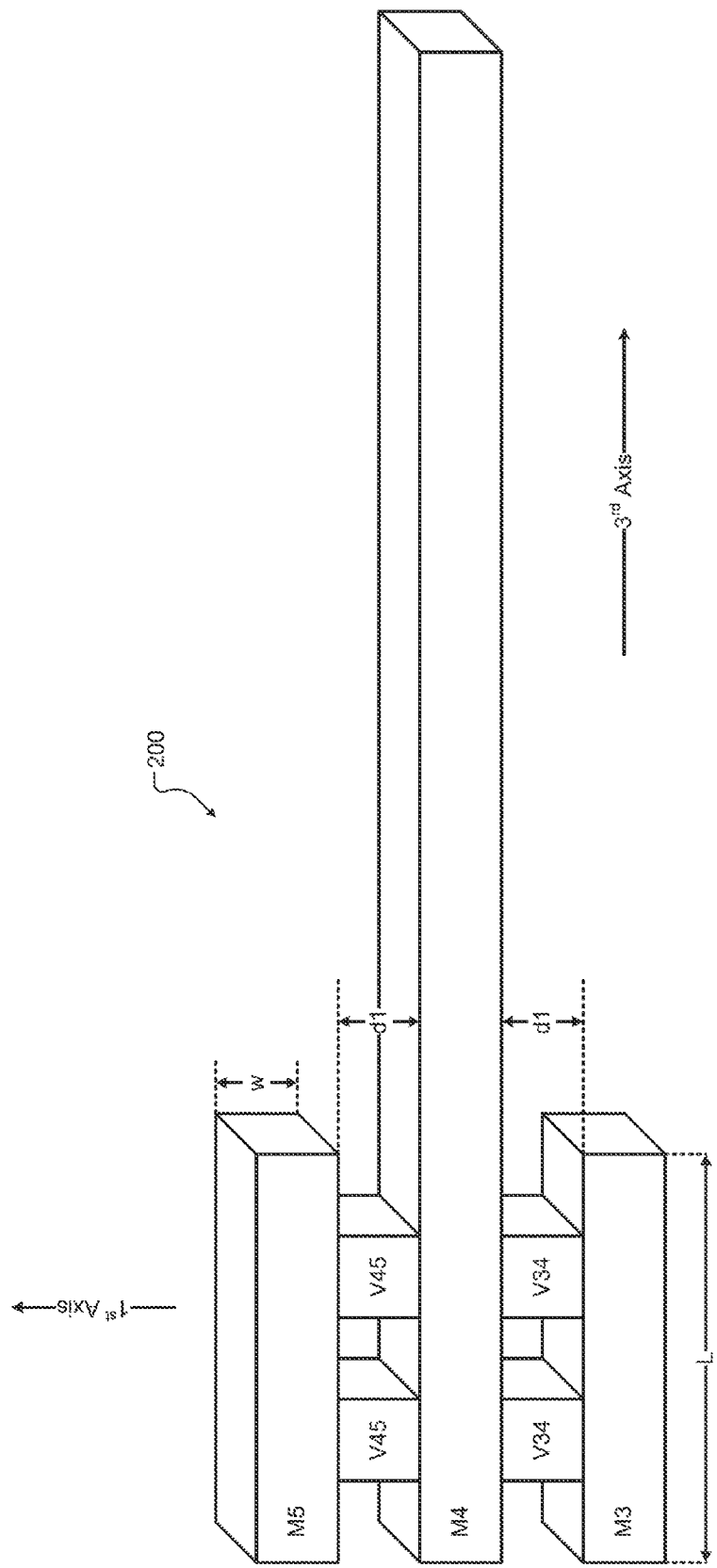
FIG. 2A shows an example of a top plate of a capacitor unit used in a capacitor array according to the present disclosure.

FIG. 2A shows an example of a top plate 200. The top plate 200 includes a plurality of conductors arranged as shown. For example only, the plurality of conductors is denoted as M3, M4, and M5. A number of conductors in the top plate 200 may be more or less than the number shown. The number of conductors in the bottom plate 100 may be greater than or equal to the number of conductors in the top plate 200. For example, when the number of conductors in the bottom plate 100 is greater than the number of conductors in the top plate 200, the number of conductors in the bottom plate 100 may be at least 3, and the number of conductors in the top plate 200 may be at least 2. Alternatively, the number of conductors in the bottom plate 100 may be at least 5, and the number of conductors in the top plate 200 may be at least 3. In general, the number of the number of conductors in the bottom plate 100 may be at least one greater than the number of conductors in the top plate 200. For example only, the bottom plate 100 shown in FIG. 1 includes five conductors, and the top plate 200 shown in FIG. 2A includes three conductors. The plurality of conductors in the top plate 200 is stacked along the first axis. A conductor in the top plate 200 is separated from an adjacent conductor by the predetermined distance d1.

Each conductor in the top plate 200 is of the predetermined length L (segment length) and the predetermined width W (segment width). Each conductor in the top plate 200 is connected to an adjacent conductor by one or more vias. For example only, the vias are denoted as V34 and V45. In the notation $V_{pq}$, p and q denote the numbers of the conductors connected by the via $V_{pq}$. The number of vias used to connect adjacent conductors may differ depending on the predetermined length L of the conductors. For example, the number of vias may be less or more than the two vias shown if the predetermined length L of the conductors $M_x$ is shorter or longer than shown.

Figure 2B:
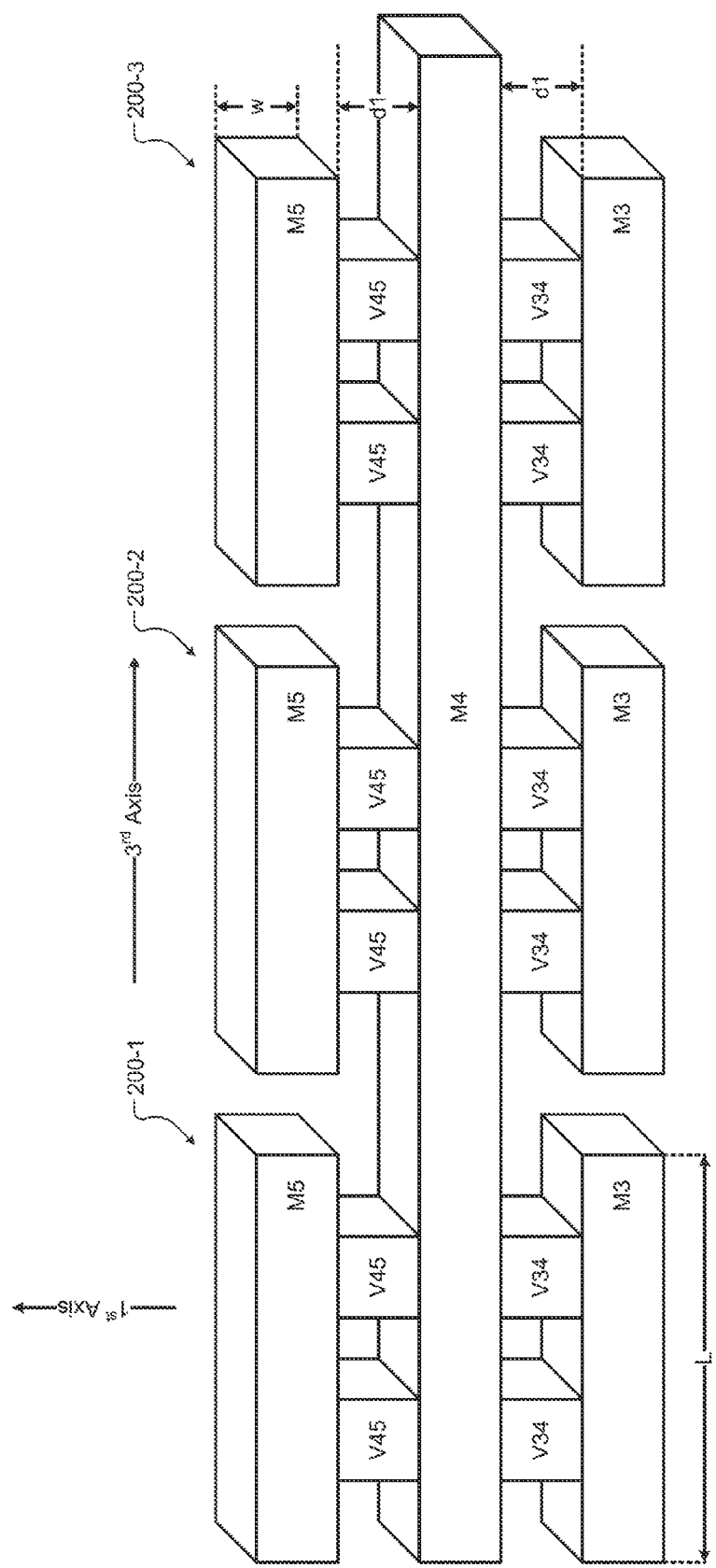
FIG. 2B shows an example of a plurality of top plates used in a capacitor array according to the present disclosure.

One of the conductors of the top plate 200 (e.g., M4) can be extended along a third axis to connect the top plate 200 to another top plate (not shown here, but see FIGS. 2B and 3). The other top plate is arranged similar to the top plate 200 along the third axis. The third axis is perpendicular to the connection 104 of the bottom plate 100. The third axis is perpendicular to the second axis and is parallel to the plane on which the substrate 102 lies. The conductor M2 of the top plate 200 and a conductor M2 of another top plate lie on a plane parallel to the plane on which the substrate 102 lies. Similarly, the conductor M3 of the top plate 200 and a conductor M3 of another top plate lie on a plane parallel to the plane on which the substrate 102 lies, and so on.

FIG. 2B shows an example of a plurality of top plates. For example only, three top plates 200-1, 200-2, and 200-3 are shown. For example only, the three top plates 200-1, 200-2, and 200-3 are connected by the conductor M4. Alternatively, a conductor other than M4 of each of the three top plates 200-1, 200-2, and 200-3 (e.g., the conductor M3 or the conductor M5) may be used connect the three top plates 200-1, 200-2, and 200-3.

FIG. 3 shows a top view of a capacitor array 300, where interconnections between a plurality of bottom plates and a plurality of top plates are shown. The capacitor array 300 includes a plurality of bottom plates (denoted as B) and a plurality of top plates (denoted as T) arranged as shown. Each of the bottom plates B may be similar to the bottom plate 100. Each of the top plates T may be similar to the top plate 200. The bottom plates and the top plates are arranged in an alternating manner along the second axis as shown. A connection similar to the connection 104 connects the bottom plates along the second axis. Along the second axis, each top plate lies between a pair of bottom plates. A capacitor unit includes a top plate and two bottom plates. Adjacent capacitor units share a bottom plate. For example, a capacitor unit 302-1 and a capacitor unit 302-2 share a bottom plate. Each top plate is separated from an adjacent bottom plate by a predetermined distance d2. The predetermined distance d1 may be greater than the predetermined distance d2.

The capacitor array 300 can be extended (and shrunk) along the second axis as well as along the third axis. FIG. 3 shows only an example. Additional top and bottom plates than those shown can be added (or removed) along the second axis and/or the third axis. After the capacitor array 300 is manufactured, the outermost capacitor units (i.e., the capacitor units along the edges or boundaries) of the capacitor array 300 are designated as dummy capacitor units. The dummy capacitor units are similar to other capacitor units within the capacitor array 300. However, the dummy capacitor units are not included in the capacitance formed by the capacitor array 300. Instead, the dummy capacitor units are utilized as follows. The top plates of the dummy capacitor units are connected to connections 306. Specifically, one of the conductors of the top plates (e.g., the conductor M4) of the dummy capacitor units is connected to a connection 306. The connections 306 are connected to a predetermined potential (e.g., ground) to improve uniformity of the capacitor array 300 without adding parasitic capacitance to the top plate of the capacitance formed by the capacitor array 300.

One of the conductors of the top plates (e.g., the conductor M4) of the capacitor units along the third axis is connected to a connection 308. The connections 308 can be used to connect the capacitor array 300 to other circuits in an integrated circuit comprising the capacitor array 300. The capacitor units along the third axis may be interconnected by one of the conductors (e.g., the conductor M4) of the top plates of the respective capacitor units. The size (i.e., value) of the capacitance of the capacitor array 300 can be varied by varying the interconnections between the capacitor units. For example, one capacitor unit 304-1 can be connected to two capacitor units 304-2, which in turn can be connected to four capacitor units 304-3 by one or more connections 308 as shown. Accordingly, in the example shown, the size (i.e., value) of the capacitance of the capacitor array 300 is equal to a sum of the one capacitor unit 304-1, the two capacitor units 304-2, and the four capacitor units 304-3.

Figure 4:
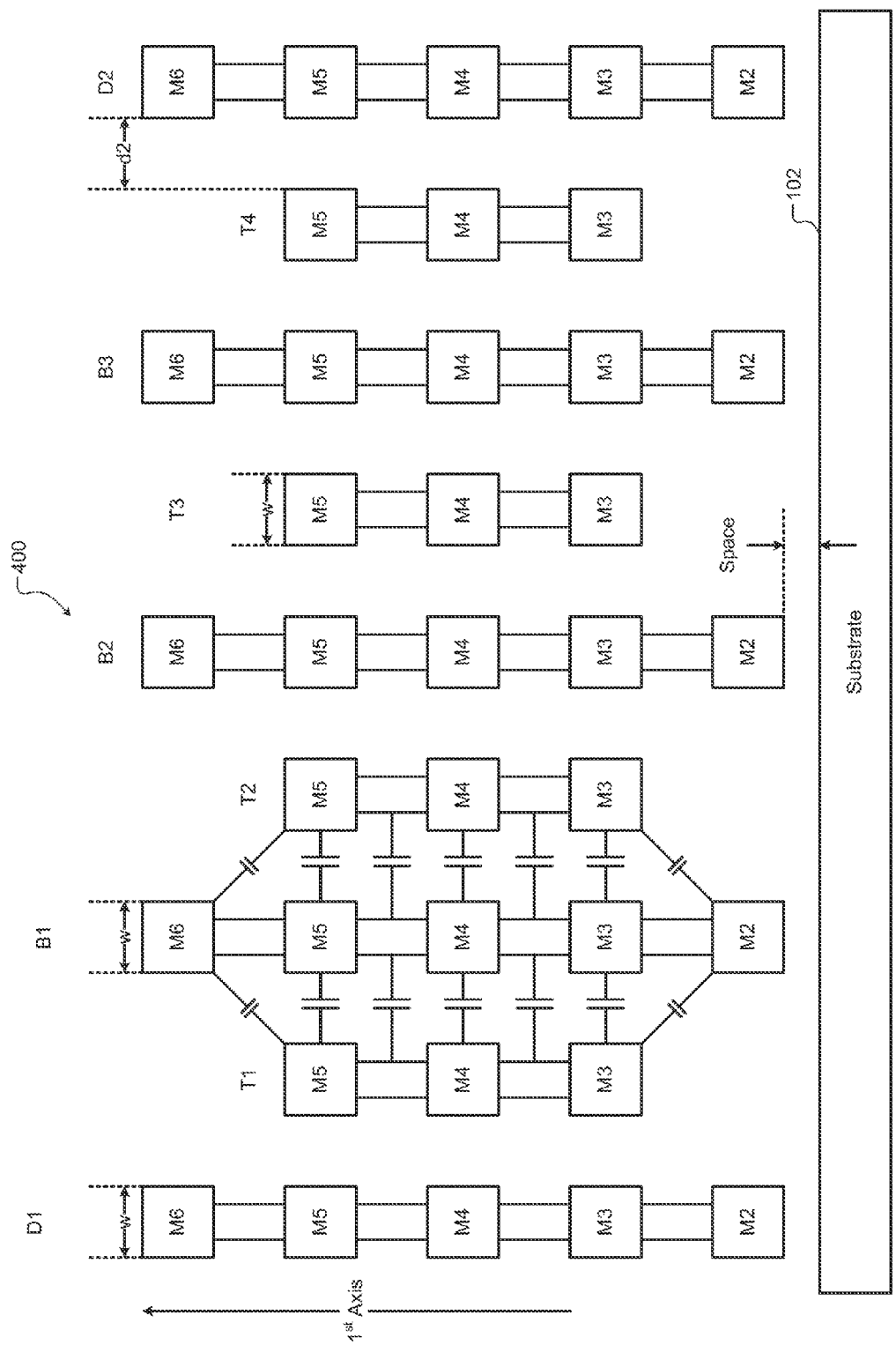
FIG. 4 shows an example of a side view of a capacitor array including a plurality of bottom plates and a plurality of top plates according to the present disclosure.

FIG. 4 shows a side view of a portion of the capacitor array 300, where capacitances formed between the top and bottom plates of the capacitor array 300 are shown. In FIG. 4, D1-D2 denote examples of bottom plates of dummy capacitor units in a portion of the capacitor array 300. T1-T4 denote examples of top plates of capacitor units in the portion of the capacitor array 300. B1-B3 denote examples of bottom plates of capacitor units in the portion of the capacitor array 300.

As shown, the conductors M2 of the bottom plates B1-B3 and D1-D2 lie on a plane perpendicular to the first axis and parallel to the plane on which the substrate 102 lies. The conductors M6 of the bottom plates B1-B3 and D1-D2 lie on a plane perpendicular to the first axis and parallel to the plane on which the substrate 102 lies. The conductors M3 of top plates T1-T4 and the conductors M3 of the bottom plates B1-B3 and D1-D2 lie on a plane perpendicular to the first axis and parallel to the plane on which the substrate 102 lies. The conductors M4 of the top plates T1-T4 and the conductors M4 of the bottom plates B1-B3 and D1-D2 lie on a plane perpendicular to the first axis and parallel to the plane on which the substrate 102 lies. The conductors M5 of the top plates T1-T4 and the conductors M5 of the bottom plates B1-B3 and D1-D2 lie on a plane perpendicular to the first axis and parallel to the plane on which the substrate 102 lies. The bottom plates B1-B3 may or may not be interconnected along the second axis.

Capacitances formed between the conductor M3 of the bottom plate B1 and the conductors M3 of each of the top plates T1 and T2 contribute to the value of the capacitance of the capacitor array 300. Capacitances formed between the conductor M4 of the bottom plate B1 and the conductors M4 of each of the top plates T1 and T2 contribute to the value of the capacitance of the capacitor array 300. Capacitances formed between the conductor M5 of the bottom plate B1 and the conductors M5 of each of the top plates T1 and T2 contribute to the value of the capacitance of the capacitor array 300.

Additionally, capacitances formed between the conductor M3 of the top plate T1 and each of the conductors M2 and M3 of the bottom plate B1 also contribute to the value of the capacitance of the capacitor array 300. Further, as shown, capacitances formed between vias interconnecting adjacent conductors of the top plate T1 and vias interconnecting adjacent conductors of the bottom plate B1, where the interconnected conductors of the top and bottom plates are coplanar, also contribute to the value of the capacitance of the capacitor array 300. The capacitance of the capacitor array 300 is inversely proportional to the predetermined distance d2 between the top and bottom plates.

Capacitances similar to those shown are also formed between the bottom plate B2 and the top plates T2 and T3, and between the bottom plate B3 and the top plates T3 and T4. These capacitances are not shown for simplicity of illustration. Further, only dominant capacitances (i.e., capacitances that contribute to the value of the capacitance of the capacitor array 300) formed between a bottom plate and a top plate are shown. Parasitic capacitances (e.g., capacitances between the conductor M3 of the top plate T1 and each of the conductors M4, M5, and M6 of the bottom plate B1; capacitances between the conductor M4 of the top plate T1 and each of the conductors M2, M3, M5, and M6 of the bottom plate B1; and so on) are omitted for simplicity of illustration.

For example only, the conductors are shown to be of the shape of a rectangle or a square. Alternatively, the conductors can be of other shapes including but not limited to a hexagon, an octagon, a circle, an oval, and so on.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. As used herein, the phrase at least one of A, B, and C should be construed to mean a logical (A or B or C), using a non-exclusive logical OR. It should be understood that one or more steps within a method may be executed in different order (or concurrently) without altering the principles of the present disclosure.

What is claimed is:

1. A system comprising:
    a first plurality of conductors stacked along a first axis on a substrate of an integrated circuit, wherein the first axis is perpendicular to a plane on which the substrate lies, wherein each conductor in the first plurality of conductors is connected to an adjacent conductor in the first plurality of conductors by one or more first vias arranged along the first axis;
    a second plurality of conductors stacked along the first axis on the substrate of the integrated circuit, wherein each conductor in the second plurality of conductors is connected to an adjacent conductor in the second plurality of conductors by one or more second vias arranged along the first axis;
    wherein the first plurality of conductors and the second plurality of conductors are arranged in parallel along a second axis (i) perpendicular to the first axis and (ii) parallel to the plane on which the substrate lies;
    wherein the first plurality of conductors respectively lie on a plurality of planes (i) perpendicular to the first axis and (ii) parallel to the plane on which the substrate lies;
    wherein the second plurality of conductors respectively lie on the plurality of planes; and
    wherein capacitances are formed along the plurality of planes between the first plurality of conductors and the second plurality of conductors; and
    a third plurality of conductors stacked along the first axis on the substrate of the integrated circuit, wherein the second plurality of conductors is arranged in parallel to and between the first plurality of conductors and the third plurality of conductors along the second axis, wherein each conductor in the third plurality of conductors is connected to an adjacent conductor in the third plurality of conductors by one or more third vias arranged along the first axis, wherein one of the first plurality of conductors is extended along a third axis perpendicular to the first and second axes to connect to one of a fourth plurality of conductors, and wherein the conductors that extend along the third axis have a predetermined constant width;
    wherein the third plurality of conductors respectively lie on the plurality of planes;
    wherein capacitances are formed along the plurality of planes between the second plurality of conductors and the third plurality of conductors; and
    wherein the fourth plurality of conductors is (i) stacked along the first axis on the substrate of the integrated circuit and (ii) arranged adjacent to the first plurality of conductors along the third axis, wherein each conductor in the fourth plurality of conductors is connected to an adjacent conductor in the fourth plurality of conductors by one or more fourth vias arranged along the first axis.

2. The system of claim 1, wherein:
    capacitances are formed along the plurality of planes between the first vias and the second vias; and
    capacitances are formed along the plurality of planes between the second vias and the third vias.

3. The system of claim 1, wherein:
    a number of conductors in the second plurality of conductors is greater than a number of conductors in the first plurality of conductors; and
    the number of conductors in the second plurality of conductors is greater than a number of conductors in the third plurality of conductors.

4. The system of claim 1, wherein:
    conductors in the first plurality of conductors, the second plurality of conductors, the third plurality of conductors, and the fourth plurality of conductors have predetermined dimensions;
    conductors in the first plurality of conductors, the second plurality of conductors, the third plurality of conductors, and the fourth plurality of conductors are separated by a first predetermined distance;
    the first plurality of conductors, the second plurality of conductors, and the third plurality of conductors are separated by a second predetermined distance; and values of the capacitances between the first plurality of conductors and the second plurality of conductors and values of the capacitances between the second plurality of conductors and the third plurality of conductors depend on one or more of (i) the predetermined dimensions, (ii) the first predetermined distance, and (iii) the second predetermined distance.

5. A system comprising:
a first set of conductors;
a second set of conductors; and
a third set of conductors;
wherein conductors in each of the first, second, and third sets are stacked along a first axis on a substrate of an integrated circuit, wherein the first axis is perpendicular to a plane on which the substrate lies;
wherein, in each of the first, second, and third sets, each conductor is connected to an adjacent conductor by one or more vias along the first axis;
wherein the first, second, and third sets of conductors are arranged in parallel along a second axis (i) perpendicular to the first axis and (ii) parallel to the plane on which the substrate lies;
wherein the second set of conductors is arranged between the first set of conductors and the third set of conductors;
wherein the first set of conductors respectively lie on a plurality of planes (i) perpendicular to the first axis, and (ii) parallel to the plane on which the substrate lies;
wherein the second set of conductors respectively lie on the plurality of planes;
wherein the third set of conductors respectively lie on the plurality of planes;
wherein a first conductor in the first set of conductors is connected to a first conductor in the third set of conductors by a connection extending from a center of the first conductor in the first set of conductors along the second axis; and
wherein the connection overlaps the second set of conductors along the first axis.

6. The system of claim 5, wherein:
capacitances are formed along the plurality of planes between the first set of conductors and the second set of conductors, and
capacitances are formed along the plurality of planes between the second set of conductors and the third set of conductors.

7. The system of claim 5, wherein:
a number of conductors in the first set of conductors is equal to a number of conductors in the third set of conductors, and
a number of conductors in the second set of conductors is less than a number of conductors in the first set of conductors.

8. The system of claim 5, further comprising:
a fourth set of conductors; and
a fifth set of conductors;
wherein conductors in each of the fourth and fifth sets are stacked along the first axis on the substrate of the integrated circuit;
wherein, in each of the fourth and fifth sets, each conductor is connected to an adjacent conductor by one or more vias along the first axis;
wherein the fourth and fifth sets of conductors are arranged in parallel along the second axis;
wherein the fourth set of conductors respectively lie on the plurality of planes;
wherein the fifth set of conductors respectively lie on the plurality of planes;
wherein the fourth set of conductors is arranged between the third set of conductors and the fifth set of conductors;
a number of conductors in the first set of conductors is equal to a number of conductors in the third set of conductors and is equal to a number of conductors in the fifth set of conductors;
a number of conductors in the second set of conductors is equal to a number of conductors in the fourth set of conductors and is less than a number of conductors in the first set of conductors; and
wherein a first conductor in the first set of conductors is connected to a first conductor in the third set of conductors and to a first conductor in the fifth set of conductors by a connection along the second axis.

9. The system of claim 8, wherein:
capacitances are formed along the plurality of planes between the first set of conductors and the second set of conductors,
capacitances are formed along the plurality of planes between the second set of conductors and the third set of conductors,
capacitances are formed along the plurality of planes between the third set of conductors and the fourth set of conductors, and
capacitances are formed along the plurality of planes between the fourth set of conductors and the fifth set of conductors.

10. The system of claim 8, further comprising:
a sixth set of conductors;
a seventh set of conductors; and
an eighth set of conductors;
wherein conductors in each of the sixth, seventh, and eighth sets are stacked along the first axis on the substrate of the integrated circuit;
wherein, in each of the sixth, seventh, and eighth sets, each conductor is connected to an adjacent conductor by one or more vias along the first axis;
wherein the sixth, seventh, and eighth sets of conductors are arranged in parallel along the second axis;
wherein the sixth set of conductors lie adjacent to the first set of conductors along a third axis perpendicular to the first and second axes;
wherein the seventh set of conductors lie adjacent to the second set of conductors along the third axis;
wherein the eighth set of conductors lie adjacent to the third set of conductors along the third axis;
wherein the seventh set of conductors is arranged between the sixth set of conductors and the eighth set of conductors;
wherein the sixth, seventh, and eighth sets of conductors respectively lie on the plurality of planes;
wherein a first conductor in the sixth set of conductors is connected to a first conductor in the eighth set of conductors by a connection along the second axis; and
wherein a conductor other than first and last conductors in the seventh set of conductors is connected to a conductor other than first and last conductors in the second set of conductors along the third axis.

11. The system of claim 10, wherein:
capacitances are formed along the plurality of planes between the first set of conductors and the second set of conductors, capacitances are formed along the plurality of planes between the second set of conductors and the third set of conductors, capacitances are formed along the plurality of planes between the third set of conductors and the fourth set of conductors, capacitances are formed along the plurality of planes between the fourth set of conductors and the fifth set of conductors, capacitances are formed along the plurality of planes between the sixth set of conductors and the seventh set of conductors, capacitances are formed along the plurality of planes between the seventh set of conductors and the eighth set of conductors.

12. A method comprising:

arranging a first plurality of conductors on a substrate of an integrated circuit, wherein the first plurality of conductors is stacked along a first axis on the substrate, and wherein the first axis is perpendicular to a plane on which the substrate lies;

connecting each conductor in the first plurality of conductors to an adjacent conductor in the first plurality of conductors by one or more first vias arranged along the first axis;

arranging a second plurality of conductors on the substrate of the integrated circuit, wherein the second plurality of conductors is stacked along the first axis on the substrate;

connecting each conductor in the second plurality of conductors to an adjacent conductor in the second plurality of conductors by one or more second vias arranged along the first axis;

arranging the first plurality of conductors and the second plurality of conductors in parallel along a second axis (i) perpendicular to the first axis and (ii) parallel to the plane on which the substrate lies;

arranging the first plurality of conductors respectively along a plurality of planes (i) perpendicular to the first axis and (ii) parallel to the plane on which the substrate lies;

arranging the second plurality of conductors respectively along the plurality of planes;

arranging a third plurality of conductors stacked along the first axis on the substrate of the integrated circuit;

arranging the second plurality of conductors is arranged in parallel to and between the first plurality of conductors and the third plurality of conductors along the second axis;

connecting each conductor in the third plurality of conductors to an adjacent conductor in the third plurality of conductors by one or more third vias arranged along the first axis;

arranging a fourth plurality of conductors (i) stacked along the first axis on the substrate of the integrated circuit and (ii) adjacent to the first plurality of conductors along a third axis;

connecting each conductor in the fourth plurality of conductors to an adjacent conductor in the fourth plurality of conductors by one or more fourth vias arranged along the first axis;

extending one of the first plurality of conductors along the third axis perpendicular to the first and second axes to connect to one of the fourth plurality of conductors, wherein the conductors that extend along the third axis have a predetermined constant width; and arranging the third plurality of conductors respectively along the plurality of planes, wherein capacitances are formed along the plurality of planes between the first plurality of conductors and the second plurality of conductors, and wherein capacitances are formed along the plurality of planes between the second plurality of conductors and the third plurality of conductors.

13. The method of claim 12, wherein:

capacitances are formed along the plurality of planes between the first vias and the second vias; and capacitances are formed along the plurality of planes between the second vias and the third vias.

14. The method of claim 12, wherein:

a number of conductors in the second plurality of conductors is greater than a number of conductors in the first plurality of conductors; and the number of conductors in the second plurality of conductors is greater than a number of conductors in the third plurality of conductors.

15. The method of claim 12, wherein:

conductors in the first plurality of conductors, the second plurality of conductors, the third plurality of conductors, and the fourth plurality of conductors have predetermined dimensions;

conductors in the first plurality of conductors, the second plurality of conductors, the third plurality of conductors, and the fourth plurality of conductors are separated by a first predetermined distance;

the first plurality of conductors, the second plurality of conductors, and the third plurality of conductors are separated by a second predetermined distance; and values of the capacitances between the first plurality of conductors and the second plurality of conductors and values of the capacitances between the second plurality of conductors and the third plurality of conductors depend on one or more of (i) the predetermined dimensions, (ii) the first predetermined distance, and (iii) the second predetermined distance.

16. A system comprising:

a first plurality of conductors stacked along a first axis on a substrate of an integrated circuit, wherein the first axis is perpendicular to a plane on which the substrate lies, wherein each conductor in the first plurality of conductors is connected to an adjacent conductor in the first plurality of conductors by one or more first vias arranged along the first axis;

a second plurality of conductors stacked along the first axis on the substrate of the integrated circuit, wherein each conductor in the second plurality of conductors is connected to an adjacent conductor in the second plurality of conductors by one or more second vias arranged along the first axis; and a third plurality of conductors stacked along the first axis on the substrate of the integrated circuit, wherein each conductor in the third plurality of conductors is connected to an adjacent conductor in the third plurality of conductors by one or more third vias arranged along the first axis, wherein the third plurality of conductors is arranged between the first plurality of conductors and the second plurality of conductors and is spaced from each of the first plurality of conductors and the second plurality of conductors by a predetermined distance, wherein the third plurality of conductors includes two more conductors than each of the first plurality of conductors and the second plurality of conductors, and wherein first and last of the third plurality of conductors are the two more conductors;

wherein the first plurality of conductors and the second plurality of conductors are arranged in parallel along a second axis (i) perpendicular to the first axis and (ii) parallel to the plane on which the substrate lies;

wherein the first plurality of conductors respectively lie on a plurality of planes (i) perpendicular to the first axis and (ii) parallel to the plane on which the substrate lies;

wherein the second plurality of conductors respectively lie on the plurality of planes; and wherein capacitances are formed along the plurality of planes between the first plurality of conductors and the second plurality of conductors.

* * * * *